US008203155B2

(12) United States Patent
Wang et al.

(10) Patent No.: US 8,203,155 B2
(45) Date of Patent: Jun. 19, 2012

(54) CAVITY-ENHANCED MULTISPECTRAL PHOTONIC DEVICES

(75) Inventors: Jianfei Wang, Cambridge, MA (US);
Juejun Hu, Cambridge, MA (US);
Anuradha M. Agarwal, Weston, MA (US); Xiaochen Sun, Los Angeles, CA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 98 days.

(21) Appl. No.: 12/815,820

(22) Filed: Jun. 15, 2010

(65) Prior Publication Data

US 2011/0127547 A1 Jun. 2, 2011

Related U.S. Application Data

(60) Provisional application No. 61/265,433, filed on Dec. 1, 2009.

(51) Int. Cl.
*H01L 33/00* (2010.01)
*G02B 6/00* (2006.01)

(52) U.S. Cl. ........... 257/84; 257/E33.077; 257/E33.069; 385/12

(58) Field of Classification Search .................... 257/84, 257/98, 81, E33.069, E33.077; 385/10, 12, 385/14
See application file for complete search history.

(56) References Cited

U.S. PATENT DOCUMENTS

| 5,978,401 | A | * | 11/1999 | Morgan ..................... 372/50.21 |
| 6,858,882 | B2 | | 2/2005 | Tsuda et al. |
| 2003/0030870 | A1 | * | 2/2003 | Joannopoulos et al. ...... 359/161 |
| 2004/0169188 | A1 | | 9/2004 | Nunoue et al. |
| 2005/0029510 | A1 | | 2/2005 | Mears et al. |

FOREIGN PATENT DOCUMENTS

| WO | 0004593 A1 | 1/2000 |
| WO | 2004033813 A2 | 5/2004 |

OTHER PUBLICATIONS

International Search Report for International Application No. PCT/US2010/054222, Mailed on Jul. 6, 2011.

* cited by examiner

*Primary Examiner* — A. Sefer
*Assistant Examiner* — Nikolay Yushin
(74) *Attorney, Agent, or Firm* — Gesmer Updegrove LLP

(57) ABSTRACT

A multispectral pixel structure is provided that includes a plurality of stacked cavity arrangements for emitting or detecting a plurality of specified wavelengths, wherein each stacked cavity arrangement having a photoactive layer for spectral emission or detection of one of the specified wavelengths. The photoactive layer is positioned within a resonant cavity stack and the resonant cavity stack being positioned between two adjacent mirror stacks. A plurality of coupling-matching layers are positioned between one or more of the stack mirror arrangements for controlling optical phase and coupling strength between emitted or incident light and resonant modes in each of the stacked cavity arrangements.

21 Claims, 3 Drawing Sheets

CAVITY-ENHANCED MULTISPECTRAL PHOTONIC DEVICES

PRIORITY INFORMATION

This application claims priority from provisional application Ser. No. 61/265,433 filed Dec. 1, 2009, which is incorporated herein by reference in its entirety.

BACKGROUND OF THE INVENTION

The invention is related to the field of photonic devices, and in particular to cavity enhanced photonic devices capable of emitting or detecting multiple wavelengths simultaneously in a single pixel.

Multispectral infrared (IR) detection has been widely employed for applications including hyperspectral imaging, IR spectroscopy, and target identification. Traditional multispectral detection technology is based on the combination of single spectral Focal Plane Arrays (FPAs) and spectral filters or spectrometers, which require bulky, high-cost mechanical scanning instruments and have a slow response. Single pixels capable of detecting multiple wavebands simultaneously enable dramatically simplified system design with superior mechanical robustness, and thus have become the focus of third generation FPA development. Recently, three-color HgCdTe (MCT) photodiodes have been demonstrated, although their spectral cross talk is still large (>10%) due to radiative coupling. A competing multi-color detector technology is quantum-well IR photodetectors (QWIPs). However, QWIP device optimization is largely limited by its low quantum efficiency (<10%). Another alternative solution, tandem detectors have limited band selection options and large cross talk due to challenges associated with material compatibility and band edge absorption. A solution which combines high quantum efficiency and low spectral cross talk is yet to be explored.

SUMMARY OF THE INVENTION

According to one aspect of the invention, there is provided an optical device. The optical device includes a plurality of stacked cavity arrangements for emitting or detecting a plurality of specified wavelengths, wherein each stacked cavity arrangement having a photoactive layer for spectral emission or detection of one of the specified wavelengths. The photoactive layer is positioned within a resonant cavity stack and the resonant cavity stack is positioned between two adjacent mirror stacks. A plurality of coupling-matching layers are positioned between one or more of the stack mirror arrangements for controlling optical phase and coupling strength between emitted or incident light and resonant modes in each of the stacked cavity arrangements.

According to another aspect of the invention, there is provided a multispectral pixel structure. The multispectral pixel structure includes a plurality of stacked cavity arrangements for emitting or detecting a plurality of specified wavelengths, wherein each stacked cavity arrangement having a photoactive layer for spectral emission or detection of one of the specified wavelengths. The photoactive layer is positioned within a resonant cavity stack and the resonant cavity stack is positioned between two adjacent mirror stacks. A plurality of coupling-matching layers are positioned between one or more of the stack mirror arrangements for controlling optical phase and coupling strength between emitted or incident light and resonant modes in each of the stacked cavity arrangements.

According to another aspect of the invention, there is provided a method of forming an optical device. The method includes forming a plurality of stacked cavity arrangements for emitting or detecting a plurality of specified wavelengths, wherein each stacked cavity arrangement having a photoactive layer for spectral emission or detection of one of the specified wavelengths. The photoactive layer is positioned within a resonant cavity stack and the resonant cavity stack is positioned between two adjacent mirror stacks. Also, the method includes positioning a plurality of coupling-matching layers between one or more of the stack mirror arrangements for controlling optical phase and coupling strength between emitted or incident light and resonant modes in each of the stacked cavity arrangements.

DETAILED DESCRIPTION OF THE INVENTION

The invention involves a novel design of cavity-enhanced photonic devices capable of emitting or detecting multiple wavelengths simultaneously in a single pixel. The invention is based on phase-tuned propagation of resonant modes in cascaded planar resonant cavities. Moreover, the invention can be generalized to emit or detect multiple wavelength combinations covering the entire ultraviolet (UV) to infrared (IR) spectrum. In the detecting part, besides its multispectral detection capability, the invention also features minimal spectral cross talk and significantly suppressed noise. In the light emission part, gain medium can replace the photodetection material in the design, and thus enable multi-color light emission in single pixel. Resonant cavity structure can also help to increase the extraction coefficient for the multi-wavelength light source, so both multi-color lasers and sub-threshold cavity enhanced light emitting diodes (LEDs) can be designed according to our concept. Both the intrinsic design versatility and scalability, as well as process compatibility with planar microfabrication, suggest the design's wide application potential for: telecommunications, e.g. multi-wavelength light sources/photodetectors for WDM; solid-state lighting with arbitrary combination and number of colors, e.g. white light for illumination; multi-spectral photovoltaics; infrared hyperspectral imaging/spectroscopy; and biochemical sensing/identification.

Figure 1:
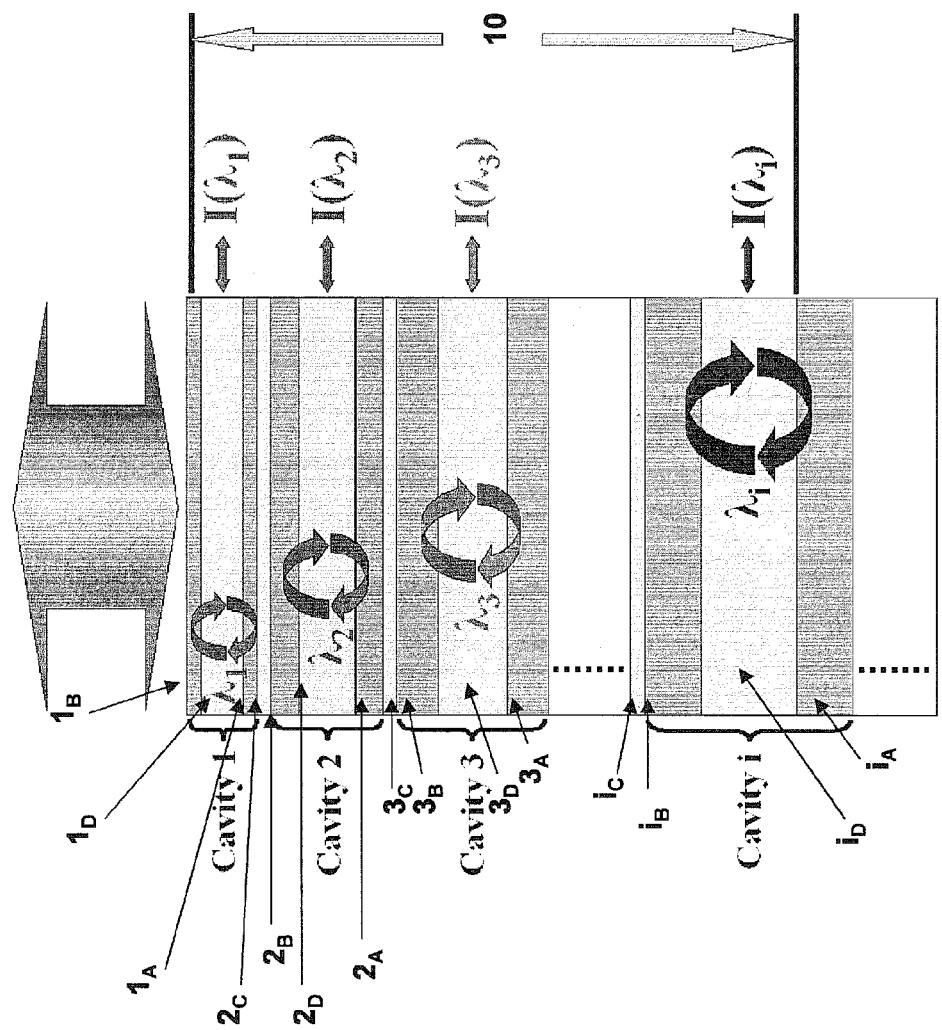
FIG. 1 is a schematic diagram illustrating a cross sectional view of the inventive multispectral pixel.

The inventive approach involves a multi-layer cascaded cavity structure shown schematically in FIG. 1. Each wavelength ($\lambda_1$-$\lambda_i$) to be emitted or detected leads to a unique resonant cavity mode locally confined within one cavity ($1$-$i$), where a photoactive layer ($1_D$-$i_D$) is placed for spectral selective emission or detection of this wavelength. Each of the active layers ($1_D$-$i_D$) is positioned within a cavity and each cavity is between quarter wavelength stacks (QWS) ($1_A$-$i_A$, $1_B$-$i_B$). The major challenge is the spatial localization of the resonant modes without compromising quantum efficiency. The invention employs a novel phase-tuned propagation design. In this approach, phase-tuning layers ($1_C$-$i_C$) are inserted between the cascaded cavities ($1$-$i$) to control the optical phase and hence the coupling strength between the emitted or incident light and the resonant modes. Thereby, one can show that critical coupling and near unity quantum efficiency (QE) can be achieved for all cavities.

Comparing to previous work on multispectral detection using a single cavity, spectral cross talk is significantly suppressed in the inventive design given the wavelength-selective spatial localization of resonant modes in different cavities. Electrical signals $I(\lambda_1)$-$I(\lambda_i)$ originating from each wavelength can be separately read out by contacting the corresponding active layer, either in a photoconductive or in a photovoltaic mode. Further, since resonant cavity enhancement (RCE) effect leads to optical field build-up in the cavity and dramatically increases absorption, photoactive layers with reduced thickness can be used while maintaining near unity QE. Consequently, photodetector noise can be suppressed without compromising responsivity. The design principles of the inventive multispectral pixel design are analyzed using the transfer matrix method (TMM). These principles are then illustrated by a specific design example. The method can be generalized to emit or detect virtually any multiple wavelength combination covering the entire UV to IR spectrum, and thus holds immense potential for the aforementioned applications.

To start with, one can consider a photoactive layer sandwiched within a generic multi-layer resonant cavity stack, where near unity light emission or absorption (internal QE) can be attained when the critical coupling condition is met at resonant wavelength:

$$R_t = (1-A_L)R_b, R_b \to 1 \quad (1)$$

where $R_t$ and $R_b$ are the reflectance values of top and bottom mirrors, and $A_L$ denotes the optical resonant mode gain or loss. When the cavity quality factor $Q \gg 1$, $A_L$ can be calculated using cavity perturbation theory as:

$$A_L = \varepsilon d \cdot \frac{\int_{active} \alpha |E_0|^2 dV}{\int_{stack} \varepsilon_c |E_0|^2 dV} \quad (2)$$

where $\varepsilon$ and $\alpha$ are the dielectric constant and gain or absorption coefficient of the photoactive material, d is the cavity length, $E_0$ denotes the electric field distribution of the resonant mode, and $\varepsilon_c$ gives the dielectric constant profile of the stack. Notably, when the active material completely fills the cavity between the two mirrors, $A_L$ can simply be given as $(1-e^{-2\alpha d})$ and Eq. 1 reduces to the critical coupling formulation by Unlu. Eq. 1 states that given a bottom mirror with near unity reflectance ($R_b \to 1$) and a specific thickness of photoactive material in the cavity, maximum QE at resonant wavelength may be obtained by appropriately choosing a top mirror reflectance ($R_t$) to satisfy Eq. 1.

Figure 2:
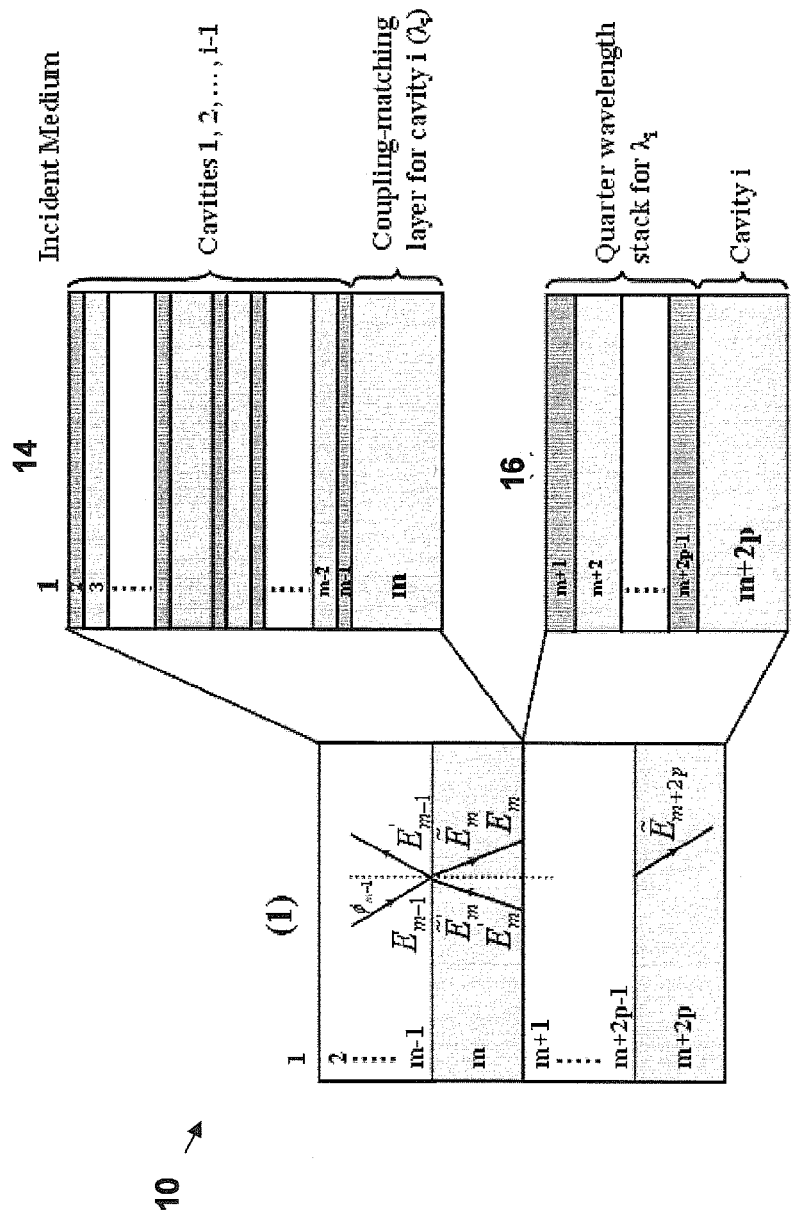
FIG. 2 is a schematic diagram illustrating structures used in deriving the coupling-matching condition.

Now one can apply the above analysis to the ith (i=1, 2, 3 . . . ) cavity in the cascaded structure in FIG. 1. As is shown in FIG. 2, the "top mirror" stack 10 of the ith cavity includes cavities 1 to i−1. In order to satisfy Eq. 1, an additional coupling-matching layer m is inserted in the top mirror stack 10. The top mirror stack 10 is further divided by sections 14, 16. Section 14 contains a portion of the top mirror stack 10 that includes the coupling-matching layer in and all layers positioned on the top surface region of the coupling-matching layer m. Section 16 includes all layers positioned on the bottom surface of the coupling-matching layer m. As is shown below, incorporation of the coupling-matching layer m allows effective tuning of the top mirror reflectance $R_{t,i}$ (where i denotes the sequential number of cavity in the stack), and thereby the critical coupling condition can be met by choosing an appropriate coupling-matching layer thickness.

Here TMM is used to derive the top mirror reflectance $R_{t,i}$ of the ith cavity in the stack, as is shown in FIG. 2. Following the standard convention, the layers are labeled sequentially starting from the surface medium. The transfer matrix $T_f$ of the entire stack can be written as:

$$T_f = T_{(3)} \cdot M_1^{-1} \cdot M_m \cdot L_m \cdot T_{(2)} \quad (3)$$

where $T_{(2)}$ corresponds to the transfer matrix of layers from the 1st to the (i−1)th cavity including the mth coupling-matching layer, and $T_{(3)}$ is transfer matrix of the quarter wavelength stack (QWS) designed for the ith cavity's resonant wavelength $\lambda_i$. It can be proven that the matrix $T_{(2)}$ may be generically represented as:

$$T_{(2)} = M_m^{-1} \cdot (M_{m-1} \cdot L_{m-1} \cdot M_{m-1}^{-1})L(M_2 \cdot L_2 \cdot M_2^{-1}) \cdot M_1 \quad (4)$$

$$= \begin{pmatrix} T_{(2)22} e^{-i\theta_{22}} & T_{(2)21} e^{-i\theta_{21}} \\ T_{(2)21} e^{i\theta_{21}} & T_{(2)22} e^{i\theta_{22}} \end{pmatrix}$$

where $T_{(2)21}$, $T_{(2)22}$, $\theta_{21}$, and $\theta_{22}$ are functions of $\phi_j$, $n_j$, $\mu_j$, $t_j$ to (j=1 to m), and $\lambda$. $T_{(3)}$ follows the general formulation of QWS transfer matrices at normal angle ($\lambda=\lambda_1$, p pairs):

$$T_{(3)} = M_{m+2p}^{-1} \cdot (M_{m+2p-1} \cdot L_{m+2p-1} \cdot M_{m+2p-1}^{-1})L \quad (5)$$

$$(M_{m+1} \cdot L_{m+1} \cdot M_{m+1}^{-1}) \cdot M_1$$

$$= (i)^{2p-1} \cdot \begin{pmatrix} A+B & -A+B \\ A-B & -A-B \end{pmatrix}$$

$$\text{where } A = \frac{n_1}{2n_{m+2p-1}} \cdot \left(\frac{n_{m+2}}{n_{m+1}}\right)^{p-1}, B = \frac{n_{m+2p-1}}{2n_{m+2p}} \cdot \left(\frac{n_{m+1}}{n_{m+2}}\right)^{p-1} \quad (6)$$

Substituting Eq. 4 and 5 into Eq. 3 produces the following relation:

$$R_{t,i} = |r|^2 \quad (7)$$

$$= \left|-\frac{T_{f21}}{T_{f22}}\right|^2$$

$$= \left|\frac{A \cdot n_m \cdot (T_{(2)21} e^{i(\theta_{21}+\theta_{22})} - T_{(2)22} e^{2i\delta_m}) +}{A \cdot n_m \cdot (T_{(2)22} e^{i(\theta_{21}+\theta_{22})} - T_{(2)21} e^{2i\delta_m}) +} \frac{B \cdot n_1 \cdot (T_{(2)21} e^{i(\theta_{21}+\theta_{22})} + T_{(2)22} e^{2i\delta_m})}{B \cdot n_1 \cdot (T_{(2)22} e^{i(\theta_{21}+\theta_{22})} + T_{(2)21} e^{2i\delta_m})}\right|$$

where $$\delta_m = \frac{2\pi}{\lambda_i} n_m t_m,$$

and $n_m$ and $t_m$ are refractive index and thickness of the mth layer, i.e. the coupling-matching layer at $\lambda_i$. Such a functional dependence provides a lever to tune $R_{t,i}$ simply by adjusting $t_m$ to satisfy Eq. 1 and thereby reach near unity QE. In the example given later, how the critical coupling condition can be solved graphically is illustrated.

To summarize, one can follow the generic procedures to design multispectral light sources or photodetectors for selectively emitting or detecting N different wavelengths $\lambda_1$, $\lambda_2$, . . . $\lambda_N$:

1) Select mirror materials for the N wavelengths to avoid overlapping $\lambda_i$ and the photonic stop bands of cavities 1 to i−1, and to minimize parasitic loss due to mirror absorption;

2) Start from the first cavity on top of the stack, choose appropriate numbers of top/bottom mirror QWS pairs to satisfy Eq. 1;

3) Move on to the next cavity i, adjust the coupling-matching layer thickness sandwiched between cavity i−1 and cavity i so that the critical coupling condition is met;

4) Repeat steps 2) and 3) until the entire stack design is complete.

The design procedures ensure that near unity quantum efficiency is attained for all N different wavelengths; in addition, as we will show in the following embodiment, the high degree of modal spatial localization ensures minimal cross talk between the different wavelengths to be emitted or detected. In reality, the coupling-matching layers can be chosen from metal materials, dielectric materials, glass materials, etc. The mirror/reflector layers/stacks in the cavities in FIG. 1 can employ: metal layers, dielectric stacks, dielectric quarter-wavelength stacks, and photonic crystals. The photoactive layers in the cavity can be group IV and compound semiconductors, such as: III-V materials; II-VI materials; Ge and doped Ge; Si and doped Si; SiGe alloys; lead salts such as PbS, PbSe, PbTe, and their alloys; CdS, CdSe, CdTe, and their alloys; ZnS, ZnSe, ZnTe, and their alloys; HgS, HgSe, HgTe, and their alloys; AlSb, GaSb, InSb, and their alloys; MnS, MnSe, MnTe, and their alloys; $In_xAs_{1-x}Sb$ (x: from 0 to 1); $Ga_xIn_{1-x}Sb$ (x: from 0 to 1); $Hg_xCd_{1-x}Te$ (x: from 0 to 1); metal doped chalcogenide glasses, etc.

As an example to validate the design principles, $\lambda_1$=1550 nm and $\lambda_2$=3600 nm are chosen as the two wavelengths to be detected. However, due to the intrinsic design versatility and scalability, the concept can be employed for arbitrary combination and number of wavelengths emission or detection.

Figure 3A:
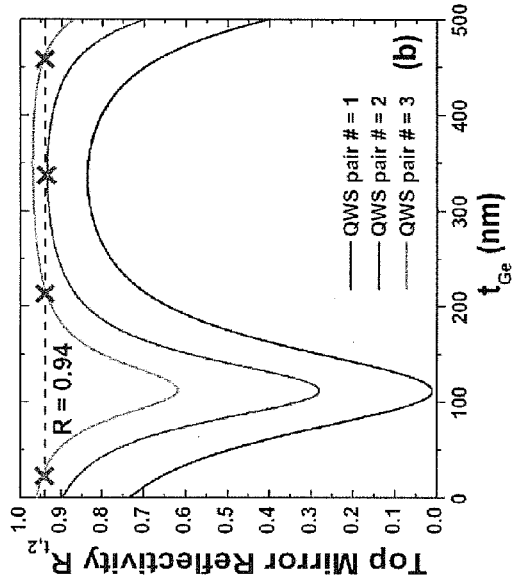
FIGS. 3A-3D are schematic diagram and graphs illustrating an embodiment formed in accordance with the invention.

$As_2S_3$ and a-Ge are used as the low and high index mirror materials given their excellent IR-transparency. As an example, FIG. 3A shows an inset 22 illustrating an SEM cross-section image of a multi-layer mid-IR Bragg mirror 22 fabricated using simple, low cost evaporation and sputtering techniques. Their wavelength-dependent refractive index values are calculated from experimentally measured transmittance spectra using the Swanepoel approach. PbTe layers of 50 nm and 100 nm in thickness are used as photoactive materials in two cascaded resonant cavities, and the refractive index values are measured using ellipsometry.

Figure 3B:
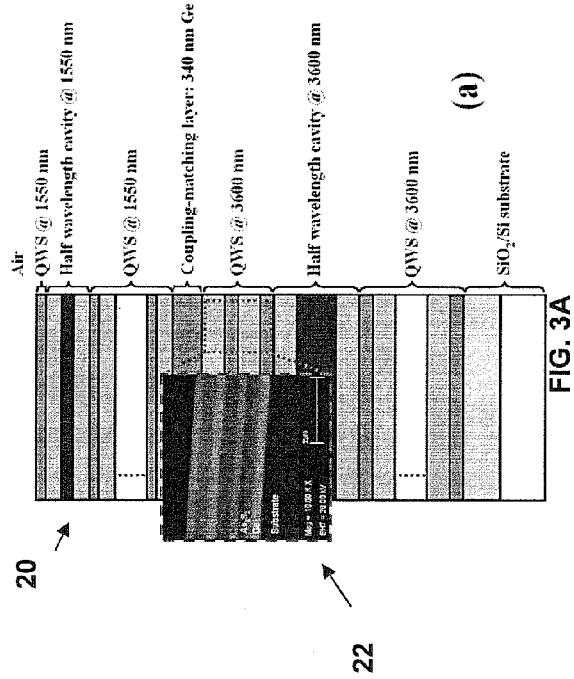
Figure 3C:
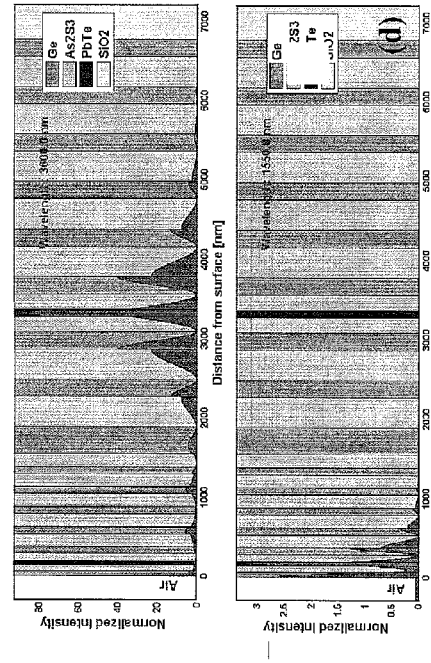

FIG. 3A shows a schematic cross-section of the pixel designed following the procedures detailed above. The solid curves in FIG. 3B plot $R_{t,2}$ as a function of coupling-matching layer's thickness for different QWS pair numbers, the dashed line indicates the reflectance corresponding to the critical coupling condition Eq. 1, and the green crosses denote the thickness values at which the critical coupling condition is met. Here we use a QWS pair number of 2 and a 340 nm thick Ge layer sandwiched between the two cavities as the coupling-matching layer. FIG. 3C shows the QE spectra for the two PbTe photoactive layers. Peak quantum efficiencies over 80% have been realized simultaneously in both wavebands with only 50 nm and 100 nm thick PbTe photoactive layers given the strong resonant cavity enhancement. In comparison, a conventional free-space PbTe photodetector operating at 3600 nm wavelength requires a photoactive layer as thick as 10 μm. As a consequence, the generation-recombination and Johnson noise in our design will be 10 times lower, since both types of noises scale with the square root of the photoactive material volume.

Figure 3D:
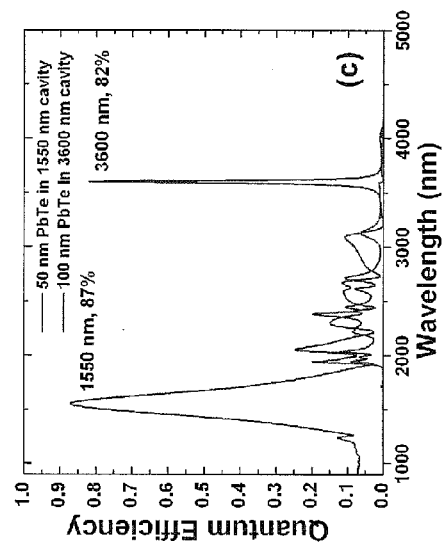

Besides the high QE, the high degree of spatial localization of modes effectively minimizes cross talk between the two photoactive layers. FIG. 3D plots the light intensity distributions in the stack at the two designed resonant wavelengths. Spectral cross talk in a dual wavelength detector can be measured using:

$$\text{Crosstalk} = \frac{\eta_{active2}(\lambda_1)}{\eta_{active2}(\lambda_2)}, \lambda_1 < \lambda_2 \tag{8}$$

where $\eta_{active2}(\lambda_1)$ is the QE of $2^{nd}$ photoactive layer at $\lambda_1$, and $\eta_{active2}(\lambda_2)$ is the peak QE of $2^{nd}$ photoactive layer at $\lambda_2$. This design leads to spectral cross talk as low as 0.1%, more than two orders of magnitude lower compared to a tandem design or a single cavity design.

The invention provides a versatile and scalable design for cavity-enhanced light sources or photodetectors capable of emitting or detecting multiple wavebands simultaneously in a single pixel. The design is based on phase-tuned propagation in cascaded planar resonant cavities and this concept can be generalized to emit or detect virtually any arbitrary number of wavelengths. This inventive pixel structure combines high QE, reduced detector noise as well as low spectral cross talk, and thus may find wide applications in security surveillance, hyperspectral imaging, and IR spectroscopy.

Although the present invention has been shown and described with respect to several preferred embodiments thereof, various changes, omissions and additions to the form and detail thereof, may be made therein, without departing from the spirit and scope of the invention.

What is claimed is:

1. An optical device comprising: a plurality of stacked cavity arrangements for emitting or detecting a plurality of specified wavelengths simultaneously in a single pixel, wherein each stacked cavity arrangement having a photoactive layer for spectral emission or detection of one of the specified wavelengths, said photoactive layer being positioned within a resonant cavity stack and the resonant cavity stack being positioned between two adjacent minor stacks; and a plurality of coupling-matching layers being positioned between adjacent stacked cavity arrangements, a plurality of the resonant cavity stacks are arranged vertically and the coupling-matching layers are inserted between adjacent resonant cavity stacks to enhance quantum efficiency.

2. The optical device of claim 1, wherein the stacked cavity arrangements comprise cascaded cavity arrangements.

3. The optical device of claim 1, wherein the stacked cavity arrangements comprise means for electrical injection to emit each of the specified wavelengths, or reading electrical signals originating from each of the specified wavelengths.

4. The optical device of claim 1, wherein the specified wavelengths comprise the ultraviolet (UV) to infrared (IR) spectrum.

5. The optical device of claim 1, wherein the photoactive layers in the cavity can be group IV and compound semiconductors, such as: III-V materials; II-VI materials; Ge and doped Ge; Si and doped Si; SiGe alloys; lead salts such as PbS, PbSe, PbTe, and their alloys; CdS, CdSe, CdTe, and their alloys; ZnS, ZnSe, ZnTe, and their alloys; HgS, HgSe, HgTe, and their alloys; AlSb, GaSb, InSb, and their alloys; MnS, MnSe, MnTe, and their alloys; $In_xAs_{1-x}Sb$ (x: from 0 to 1); $Ga_xIn_{1-x}Sb$ (x: from 0 to 1); $Hg_xCd_{1-x}Te$ (x: from 0 to 1); metal doped chalcogenide glasses.

6. The optical device of claim 1, wherein the mirror stacks can employ metal layers, dielectric stacks, dielectric quarter-wavelength stacks, and photonic crystals.

7. The optical device of claim 6, wherein the coupling-matching layers can be chosen from metal materials, dielectric materials, glass materials.

8. A multispectral pixel structure comprising: a plurality of stacked cavity arrangements for emitting or detecting a plurality of specified wavelengths simultaneously in a single pixel, wherein each stacked cavity arrangement having a photoactive layer for spectral emission or detection of one of the specified wavelengths, said photoactive layer being positioned within a resonant cavity stack and the resonant cavity stack being positioned between two adjacent mirror stacks; and a plurality of coupling-matching layers being positioned between adjacent stacked cavity arrangements a plurality of the resonant cavity stacks are arranged vertically and the coupling-matching layers are inserted between adjacent resonant cavity stacks to enhance quantum efficiency.

9. The multispectral pixel structure of claim 8, wherein the stacked cavity arrangements comprise cascaded cavity arrangements.

10. The multispectral pixel structure of claim 8, wherein the stacked cavity arrangements comprise means for electrical injection to emit each of the specified wavelengths, or reading electrical signals originating from each of the specified wavelengths.

11. The multispectral pixel structure of claim 8, wherein the specified wavelengths comprise the ultraviolet (UV) to infrared (IR) spectrum.

12. The multispectral pixel structure of claim 8, wherein the photoactive layers in the cavity can be group IV and compound semiconductors, such as: III-V materials; II-VI materials; Ge and doped Ge; Si and doped Si; SiGe alloys; lead salts such as PbS, PbSe, PbTe, and their alloys; CdS, CdSe, CdTe, and their alloys; ZnS, ZnSe, ZnTe, and their alloys; HgS, HgSe, HgTe, and their alloys; AlSb, GaSb, InSb, and their alloys; MnS, MnSe, MnTe, and their alloys; $In_xAs_{1-x}Sb$ (x: from 0 to 1); $Ga_xIn_{1-x}Sb$ (x: from 0 to 1); $Hg_xCd_{1-x}Te$ (x: from 0 to 1); metal doped chalcogenide glasses.

13. The multispectral pixel structure of claim 8, wherein the mirror stacks can employ metal layers, dielectric stacks, dielectric quarter-wavelength stacks, and photonic crystals.

14. The multispectral pixel structure of claim 13, wherein the coupling-matching layers can be chosen from metal materials, dielectric materials, glass materials.

15. A method of forming all optical device comprising: forming a plurality of stacked cavity arrangements for emitting or detecting a plurality of specified wavelengths simultaneously in a single pixel, wherein each stacked cavity arrangement having a photoactive layer for spectral emission or detection of one of the specified wavelengths, said photoactive layer being positioned within a resonant cavity stack and the resonant cavity stack being positioned between adjacent stacked cavity arrangements a plurality of the resonant cavity stacks are arranged vertically and the coupling-matching layers are inserted between adjacent resonant cavity stacks to enhance quantum efficiency.

16. The method of claim 15, wherein the stacked cavity arrangements comprise cascaded cavity arrangements.

17. The method of claim 15, wherein the stacked cavity arrangements comprise means for electrical injection to emit each of the specified wavelengths, or reading electrical signals originating from each of the specified wavelengths.

18. The method of claim 15, wherein the specified wavelengths comprise the ultraviolet (UV) to infrared (IR) spectrum.

19. The method of claim 15, wherein the photoactive layers in the cavity can be group IV and compound semiconductors, such as: III-V materials; II-VI materials; Ge and doped Ge; Si and doped Si; SiGe alloys; lead salts such as PbS, PbSe, PbTe, and their alloys; CdS, CdSe, CdTe, and their alloys; ZnS, ZnSe, ZnTe, and their alloys; HgS, HgSe, HgTe, and their alloys; AlSb, GaSb, InSb, and their alloys; MnS, MnSe, MnTe, and their alloys; $In_xAs_{1-x}Sb$ (x: from 0 to 1); $Ga_xIn_{1-x}Sb$ (x: from 0 to 1 $Hg_xCd_{1-x}Te$ (x: from 0 to 1); metal doped chalcogenide glasses.

20. The method of claim 15, wherein the mirror stacks can employ metal layers, dielectric stacks, dielectric quarter-wavelength stacks, and photonic crystals.

21. The method of claim 20, wherein the coupling-matching layers can be chosen from metal materials, dielectric materials, glass materials.

* * * * *